United States Patent [19]

Mukogawa et al.

[11] 3,900,351

[45] Aug. 19, 1975

[54] METHOD OF PRODUCING SEMICONDUCTOR INTEGRATED CIRCUITS WITH IMPROVED ISOLATION STRUCTURE

[75] Inventors: Masashi Mukogawa; Takashi Takagaki, both of Tokyo, Japan

[73] Assignee: Nippon Electric Company Limited, Tokyo, Japan

[22] Filed: Nov. 21, 1973

[21] Appl. No.: 417,783

[30] Foreign Application Priority Data

Nov. 24, 1972 Japan .......................... 47-118175

[52] U.S. Cl. .................... 148/186; 148/187; 357/47

[51] Int. Cl.[2] .......................................... H01L 21/22

[58] Field of Search .................... 148/186, 187, 175; 317/235 E

[56] References Cited

UNITED STATES PATENTS

| | | | |
|---|---|---|---|
| 3,147,152 | 9/1964 | Mendel | 148/187 X |
| 3,244,566 | 4/1966 | Mann et al. | 148/186 |
| 3,473,093 | 10/1969 | Bilous et al. | 148/187 X |
| 3,473,976 | 10/1969 | Castrucci et al. | 148/187 X |
| 3,775,196 | 11/1973 | Wakamiya et al. | 148/187 X |

*Primary Examiner*—C. Lovell
*Assistant Examiner*—J. M. Davis
*Attorney, Agent, or Firm*—Hopgood, Calimafde, Kalil, Blaustein & Lieberman

[57] ABSTRACT

A semiconductor integrated circuit is fabricated by forming separated highly doped regions on the surface of a semiconductor and depositing a semiconductor layer on that surface. Circuit elements are formed in the layer above each of the highly doped regions, and a selected impurity is diffused through the substrate into the regions between the circuit elements. The impurity promotes conductivity of the type opposite that of the semiconductor layer.

4 Claims, 2 Drawing Figures

METHOD OF PRODUCING SEMICONDUCTOR INTEGRATED CIRCUITS WITH IMPROVED ISOLATION STRUCTURE

BACKGROUND OF THE INVENTION

The present invention relates to a novel method and structure for electrically isolating a number of circuit elements from one another in semiconductor integrated circuits, particularly in bipolar semiconductor integrated circuits.

In integrated circuits, particularly of the bipolar type, circuit elements formed therein must be electrically isolated from one another by some suitable means. Among conventional isolation techniques, there have been known the P-N junction isolation technique, the dielectric isolation technique, the airgap isolation technique, etc. Any of these techniques has the inevitable defect that wide areas are required for electrical isolation. For this reason, the integration density of a bipolar integrated circuit is relatively low.

It is an object of this invention to provide a semiconductor integrated circuit with an extremely high integration density which does not require wide isolation regions, such as diffused regions, dielectric material regions, or spatial regions, for electrical isolation.

SUMMARY OF THE INVENTION

A semiconductor integrated circuit fabricated according to the present invention comprises a semiconductor substrate a first conductivity type, an epitaxial layer of one of the two possible conductivity types formed on a major surface of the semiconductor substrate, a plurality of highly doped buried regions of the same or the opposite conductivity type situated between said semiconductor substrate and said epitaxial layer and extending to both of them, a plurality of circuit elements formed in the epitaxial layer above the buried regions, and isolation regions doped with an impurity, such as gold, with a concentration comparable to the concentration of an impurity present in the epitaxial layer. The gold-doped isolation regions are situated between adjacent circuit elements and have a high specific resistivity. The impurity of the isolation region should work as a P type impurity in an N type semiconductor and as an N type impurity in a P type semiconductor. Examples of such impurities are gold for silicon and copper for germanium.

According to the present invention, the gold-doped isolation regions are formed by diffusing gold through the semiconductor substrate from the back face thereof into the epitaxial layer. Since the highly doped buried regions act as a barrier, or a mask, for the gold diffusion, gold is intruded only from the intervals between the buried regions into the epitaxial layer, with the result that gold-doped regions are formed in the epitaxial layer except for the regions above the buried regions. Such gold diffusion should be carried out after circuit elements are formed in the epitaxial layer above the buried regions.

Since gold has the property of acting as a P-type impurity to an N-type semiconductor and an N-type impurity to a P-type semiconductor, those portions of the epitaxial layer in which gold has been diffused will have extremely high specific resistivities, enabling electrical isolation to be effective between adjacent circuit elements. Since no large regions for isolation need be formed, the spacing between any two adjacent circuit elements can be greatly reduced. Thus, a semiconductor integrated circuit with circuit elements of high density can be fabricated. Further, the semiconductor integrated circuit according to this invention is devoid of junction capacitance, the presence of which is inevitable with conventional P-N junction isolation, and in which the doped gold or copper reduces the storage time of minority carriers so that an integrated circuit having excellent high frequency performance can be obtained.

Moreover, the gold diffused into the epitaxial layer acts to balance the variation of an effective impurity concentration contributing to the conductivity type of the epitaxial layer against the conductivity type reversal that may occur due to the presence of an external electric field or ions, such as sodium ions, intruding into an insulating film formed on the surface of the epitaxial layer, with no possibility of electrical isolation being deleteriously affected by ambient effects. Further, in the presence of burried regions of high impurity concentration, there is no fear of the collector resistance becoming excessively high in spite of the high specific resistivity of the epitaxial layer. Still further, since the buried regions with a high impurity concentration act as a stopper for the gold diffusion, the conventional masking process for gold diffusion can be dispensed with by performing the gold diffusion from the semiconductor substrate side. This calls for many fewer processing steps than the various conventional fabrication techniques.

BRIEF DESCRIPTION OF THE DRAWINGS

The above and further objects, features and advantages of the present invention will become apparent upon consideration of the following detailed description of an embodiment thereof, especially when taken in connection with the accompanying drawings, wherein.

DESCRIPTION OF THE PREFERRED EMBODIMENT

Figure 1:
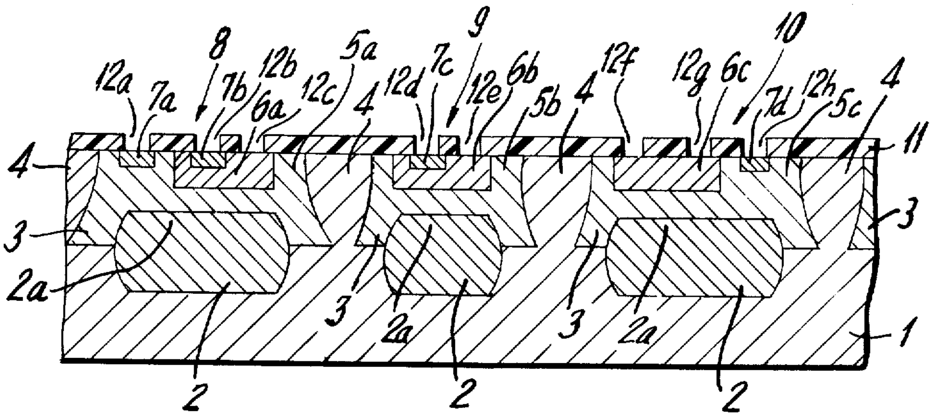
(PRIOR ART) FIG. 1
FIG. 1 is a cross sectional view in elevation of the conventional structure of a bipolar integrated circuit semiconductor device.

Conventionally, the isolation between the circuit elements in a semiconductor integrated circuit has been attained by reverse-biased P-N junctions because of the simplicity of manufacture. Referring first to FIG. 1, a conventional bipolar semiconductor integrated circuit is explained, in which, for example, an NPN transistor 8, a diode 9 and a resistor 10 are formed. $N^+$ type buried regions 2 having a high impurity concentration are formed at first by diffusion in the surface of a P-type silicon substrate 1, followed in succession by the formation of an N-type epitaxial layer 3 on the surface of the P-type substrate 1 by the known epitaxial growth method and the formation of isolation regions 4 in the epitaxial layer 3 by diffusing the P-type impurity into the epitaxial layer 3. In such a way, N-type islands 5a through 5c, electrically isolated from one another by the isolation regions 4 are formed. Then, P-type regions 6a through 6c, are simultaneously formed by diffusing P-type impurity in these islands 5a through 5c, respectively, followed further by the formation of the $N^+$ regions 7a through 7d, also by diffusing N-type impurity in the islands 5a and 5c and P-type regions 6a and 6b. Thus, an NPN transistor 8 composed of the $N^+$-type region 7b as its emitter, the P-type region 6b as its base, the N-type island 5a as its collector and the N-type region 7a as its collector contact; and a diode 9 composed of the P-type region 6b as the anode and the $N^+$-type region 7c as the cathode, and a resistor 10 consisting of the P-type region 6c are respectively formed in positions above the previously mentioned $N^+$-type buried regions 2. It is noted that the N-type region 7d is a contact for reverse biasing the P-N junction between the island 5c and the isolation region 4. Next, aluminum metallization is deposited by evaporation techniques and then the wiring (not shown in FIG. 1) is formed between these elements by selectively etching the aluminum metallization.

Incidentally, the reference numeral 11 denotes a passivation film of silicon dioxide ($SiO_2$), and 12a through 12h denote the openings for access to the wiring aluminum. Further, part 2a of each $N^+$-type buried region 2 is a portion of the epitaxial layer 3 which has been converted into $N^+$-type, by diffusion of an N-type impurity from the $N^+$ buried region 2. This diffusion occurs during the epitaxial growth process of forming the epitaxial layer 3 and during the thermal treatment thereafter.

In such conventional bipolar semiconductor integrated circuits, the isolation regions 4 occupy a wide area on the surface of the epitaxial layer 3. This is because the impurity diffusion process for forming the isolation regions 4 requires high temperature and long duration to obtain diffusion in depth to penetrate the thickness of the epitaxial layer. The surface areas of the isolation regions 4 therefore become wide. This results in low packaging density of circuit elements in a bipolar semiconductor integrated circuit wafer.

If all of the circuit elements could be incorporated in a semiconductor substrate having an extremely high specific resistivity, even with the bipolar integrated circuitry, the existence of the isolation regions would become unnecessary, and then the packaging density would become higher. However, a single crystal semiconductor of extremely high specific resistivity cannot be manufactured yet on an industrial scale with good yield. Further, when using a single crystal semiconductor having a high specific resistivity as the wafer of an integrated circuit, the semiconductor becomes highly susceptible to external effects such as alkali ions in passivation film or external electrical field, and conductivity type reversal would be likely to occur on their surfaces.

Figure 2:
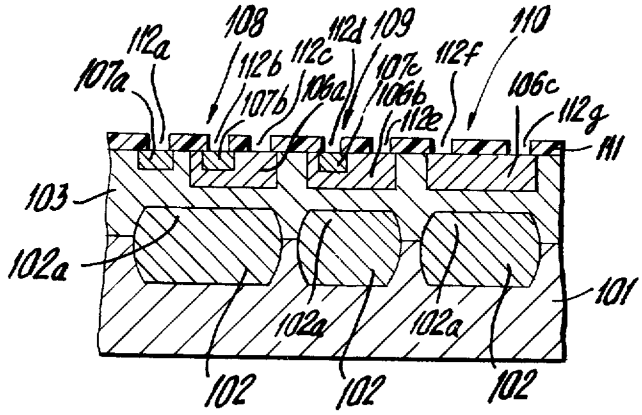
FIG. 2 is a cross sectional view in elevation of the structure of an integrated circuit semiconductor device embodying the present invention.

Referring now to FIG. 2, an embodiment of an integrated circuit semiconductor device according to this invention will be explained. In this embodiment, an integrated circuit comprises an NPN transistor 108, a diode 109, and a resistor 110 which are formed in an N type epitaxial layer 103 overlaying a P type semiconductor substrate 101, and more particularly, above buried regions 102.

As a first processing step, a plurality of buried regions 102 are formed by diffusing arsenic in amounts of the order of 1 to $2 \times 10^{19}/cm^3$ into a P-type silicon substrate 101 having a specific resistivity of 1 to 10 ohm-cm and a thickness of 350 microns. Alternatively, the buried regions 102 may be formed by diffusing antimony in amounts of the order of $7{\sim}8 \times 10^{18}/cm^3$. In any case, the concentration of the buried regions 102 should be from 5 to $10 \times 10^{18}$ atoms/$cm^3$.

As a second step, an N-type silicon layer 103 is epitaxially grown on the silicon substrate 101. The N-type epitaxial silicon layer 103 is selected to have a specific resistivity of the order of 0.6 ~ 0.7 ohm-cm and a thickness of the order of 5 ~ 7 microns. During the epitaxial growth process of the N-type silicon layer 103, the impurity present in the buried regions 102 also diffuses into the epitaxial layer 103, thereby forming the extended portions 102a. Thus, the overall thickness of the buried regions 102 becomes approximately 10 microns.

As a third step, an oxide film 111 is formed on the epitaxial layer 103 by a thermal oxidation process, and the film 111 is partially removed by the photo-etching technique. The oxide-film-removed portions are situated above these buried regions 102.

As a fourth step, boron is diffused in amounts of the order of $7{\sim}8 \times 10^{18}/cm^3$ into the silicon epitaxial layer 103 by using the oxide film 111 as a mask, thereby forming P-type regions 106a, 106b, and 106c. Although the depth of these P-type regions 106a, 106b, and 106c is approximately 2 microns, the most appropriate depths are such that these P-type regions have a separation of the order of 0.5 to 2 microns from the upper level of the buried regions 102. If excessively separated, the collector resistance of the transistor to be later formed will increase excessively, whereas if too narrowed, the production yield will become lower, because of the difficulty of the depth of the P-type regions 106a, 106b and 106c. The latter results in a decrease in the collector breakdown voltage.

As a fifth step, the silicon dioxide film 111 and the oxide produced in the diffusion process of the boron are partially removed by a photo-etching process. The oxide film produced in the diffusion process may be made thicker by thermal oxidation as required. Then, arsenic is diffused in the order of $10^{20{\sim}21}/cm^3$ through the openings of the oxide film 111 to form N-type regions 107a, 107b, and 107c of approximately 1.5 microns in depth.

Thus, an NPN transistor 108 is formed composed of the $N^+$-type region 107b as its emitter, the P-type region 106a as its base, the epitaxial layer 103 as its collector and the $N^+$-type region 107a as its collector contact. A diode 109 is composed of the P-type region 106b as its anode and the $N^+$-type region 107c as its cathode. A resistor 110 is composed of the P-type region 106c. These elements are formed in the upper positions of the epitaxial layer 103 above the aforementioned $N^+$-type buried regions 102.

This is followed by the step of growing an oxide film by thermal oxidation on the epitaxial layer 103 until its thickness reaches approximately 1 micron. In this process, the oxide film 111 formed in the previous steps may be left as it is or removed prior to this thermal oxidation.

Then gold is deposited by the vacuum evaporation technique in thickness of the order of 450 A on that surface of the silicon substrate 101, opposite to the epitaxial layer 103 and the gold deposited body is subjected to heat treatment at 1100°C for a time interval of 20 to 25 minutes to diffuse the gold into the epitaxial layer 103 through the entire thickness of the silicon substrate 101. In this process, while the gold diffuses rapidly and deeply into the silicon substrate 101 and the epitaxial layer 103, it is not diffused as much into those portions of the epitaxial layer 103 situated above the buried regions 102. This is to be true in view of the fact that the buried regions 102 provide a kind of masking action for the gold diffusion. The concentration of diffused gold in the epitaxial layer 103 is of the order of $6{\sim}7 \times 10^{15}/cm^3$, being almost equal to the impurity concentration of the epitaxial layer 103 and the specific resistivity of those portions of the epitaxial layer 103 which are not situated above the buried regions 102 and are doped with gold become as high as $10^{2\sim3}$ ohm-cm. In other words, these gold-doped regions of the epitaxial layer 103 can serve as isolation regions.

The diffused gold concentration is selected to be equal to or a little (about $1 \times 10^{15}/cm^3$) less than the impurity concentration of the epitaxial layer 103. The concentrations of the diffused gold and the impurity of the epitaxial layer 103 should be arranged in view of the two following restrictions: (1) the diffusion of gold in excess of $10^{16}$ atoms/cm$^3$ is difficult in that its solid solubility limit for silicon is reached; and (2) the impurity concentration selected for the epitaxial layer 103 should be in excess of $10^{14}$ atoms/cm$^3$ because of the surface instabilities such as the conductivity reversal, with the result that the gold concentration must be in excess of $10^{14}$ atoms/cm$^3$. For a similar reason, the equivalent gold concentration value should be selected even in cases where the epitaxial layer 103 and the substrate 101 are respectively made of N-type silicon.

As the final step, aluminum is evaporated on the oxide film 111 and the epitaxial layer 103, and a required wiring metallization pattern is formed by a photo-etching process. Aluminum wiring metallization is a well known art adopted for a necessary processing step in the manufacture of semiconductor integrated circuits. Therefore, a detailed description of this process and illustrations in the drawings have been omitted for simplicity.

With this embodiment, the conventional diffusion process for the formation of isolation regions 4 (refer to FIG. 1) can be dispensed with, and yet the integration density can be enhanced to a value about two times that of the conventional bipolar semiconductor integrated circuits. Further, the epitaxial layer 103 can be given a high resistivity state by the gold diffusion process. This gold diffusion process have been done conventionally for reducing the storage time of the minority carriers in integrated circuits for the saturation type logic circuits. Therefore, the steps of the manufacturing processes are not increased in the fabrication of integrated circuits of such type. Moreover, by performing the gold diffusion from the entire back surface of the silicon substrate 101, the conventional masking process is eliminated, resulting in fewer processing steps.

Further, gold as an impurity in silicon has the characteristic of balancing the variation of the effective impurity concentration contributing to the conductivity type in the silicon epitaxial layer 103 caused by a stray electric field or an impurity intruding into the passivation film 111. Consequently, there is no possibility of the conductivity type of the surface of the epitaxial layer 103 being reversed by a stray electric field or an impurity intruding into the insulation layer 111 as mentioned previously.

While it has been assumed in the foregoing embodiment of this invention that the semiconductor material is silicon, germanium may be used therefor, provided copper be used in lieu of gold. It will be obvious to those skilled in the art that the equivalent effect of this invention could be achieved for other semiconductor materials by selecting a suitable metal which has a large diffusion coefficient and an action of manifesting a conductivity type differing from the conductivity type of an impurity contained in such a semiconductor material.

Accordingly, the above description is merely an example of the invention and should not be construed as a limitation on its scope.

What is claimed is:

1. A method of producing a semiconductor integrated circuit comprising the steps of forming highly doped regions separated from each other on the surface of a semiconductor substrate, depositing a semiconductor layer on said surface, forming circuit elements in said semiconductor layer above each of said highly doped regions and thereafter diffusing a selected impurity through said semiconductor substrate from the entire back surface thereof and into regions of said semiconductor layer between said circuit elements by using the masking action of said highly doped regions, thereby forming high-resistivity regions between said circuit elements in said semiconductor layer, said high-resistivity regions being sufficiently high to effect electrical isolation between said circuit elements, wherein said impurity has a high diffusion coefficient in said semiconductor substrate and promotes conductivity of a type opposite to that of said semiconductor layer.

2. The method of producing a semiconductor integrated circuit set forth in claim 1, wherein said semiconductor layer is formed of silicon and wherein said impurity is gold.

3. The method of producing a semiconductor integrated circuit set forth in claim 2, wherein the concentration of said gold in said semiconductor layer is between $10^{14}$ and $10^{16}$ atoms/cm$^3$.

4. The method of producing a semiconductor integrated circuit set forth in claim 1, wherein said semiconductor layer is formed of germanium and said impurity is copper.

* * * * *